(12) United States Patent
Hsue et al.

(10) Patent No.: US 6,833,995 B1
(45) Date of Patent: Dec. 21, 2004

(54) ENCLOSURE HAVING A DIVIDER WALL FOR REMOVABLE ELECTRONIC DEVICES

(75) Inventors: Eugene Yan Ki Hsue, San Jose, CA (US); Bruce T. Arasato, San Jose, CA (US)

(73) Assignee: 3PARdata, Inc., Fremont, CA (US)

( * ) Notice: Subject to any disclaimer, the term of this patent is extended or adjusted under 35 U.S.C. 154(b) by 32 days.

(21) Appl. No.: 09/990,121

(22) Filed: Nov. 21, 2001

(51) Int. Cl.$^7$ .............................................. H05K 7/16
(52) U.S. Cl. .................... 361/727; 312/263; 312/265.4; 211/184
(58) Field of Search ................. 361/683–688, 361/724–727, 695–697, 802; 312/223.1, 223.2, 263, 265.4–265.6; 211/26, 189, 184

(56) References Cited

U.S. PATENT DOCUMENTS

| | | | | |
|---|---|---|---|---|
| 3,905,484 A | * | 9/1975 | Dean et al. ................. | 211/184 |
| 4,899,254 A | * | 2/1990 | Ferchau et al. ............. | 361/695 |
| 5,168,424 A | * | 12/1992 | Bolton et al. ............... | 361/695 |
| 5,471,099 A | * | 11/1995 | Larabell et al. ............. | 361/695 |
| 5,816,673 A | * | 10/1998 | Sauer et al. ............. | 312/223.2 |
| 6,411,506 B1 | * | 6/2002 | Hipp et al. ................. | 361/686 |
| 6,424,526 B1 | * | 7/2002 | Heard ........................ | 361/687 |
| 6,459,571 B1 | * | 10/2002 | Carteau ...................... | 361/684 |
| 6,459,589 B2 | * | 10/2002 | Manweiler et al. ......... | 361/727 |
| 6,525,935 B2 | * | 2/2003 | Casebolt ..................... | 361/687 |

* cited by examiner

*Primary Examiner*—Lisa Lea-Edmonds
(74) *Attorney, Agent, or Firm*—Patent Law Group LLP; David C. Hsia

(57) ABSTRACT

An enclosure is disclosed for housing multiple electronic devices. In one embodiment, the enclosure includes a chassis having a floor and opposing sidewalls. Discrete first and second midplanes, each having an opening formed therein, may be disposed in an interior portion of the chassis on opposite sides of a divider wall. The first and second midplanes may be configured to mate to at least one air displacement unit on a back surface of the associated midplane and to mate to at least one device sled on a front surface of the associated midplane. An opening is formed in each midplane adjacent the associated air displacement unit to permit air to pass through the opening.

19 Claims, 5 Drawing Sheets

ENCLOSURE HAVING A DIVIDER WALL FOR REMOVABLE ELECTRONIC DEVICES

CROSS REFERENCE TO RELATED APPLICATION

This is related to commonly-assigned U.S. Patent Application entitled "Enclosure for Removable Electronic Devices" by Eugene Yan Ki Hsue, filed on even date herewith, the entire disclosure of which is incorporated herein by reference.

BACKGROUND

1. Field of Invention

The present invention relates generally to enclosures for electronic devices and, more particularly, to a system and apparatus for housing multiple electronic devices in a common enclosure.

2. Related Art

With advancements in data communications and computing technologies, ever-increasing numbers of electronic devices need to be housed. These electronic devices, may include, for example, data storage devices, data processing devices, and the like. CD ROM drives, floppy disk drives, optical disk drives, and high-density disk drives are examples of various data storage devices that are currently available.

Because electronic devices, such as data storage devices, may wear out or malfunction, in certain computing systems, it is desirable to house such devices such that, they are easily removable, replaceable, or both. For example, high-density disk drives are currently utilized to store large quantities of information. Most high-density disk drives, however, are enclosed within systems that do not provide easy access to individual drives. That is, to remove one drive, one or more other drives may need to be removed or disturbed.

In an environment where it is necessary to frequently access the housed electronic devices, such as for repair or replacement, ready access to the electronic devices in an efficient and reliable fashion is desirable. Some electronic devices, such as data storage devices, may frequently need to be replaced or removed from a housing or other enclosure.

Further, where a multiple electronic devices are mounted within a common enclosure, it is desirable to minimize the number of electronic devices that must be physically disturbed when removing or replacing one or more of the electronic devices within the enclosure. To save space, it is also desirable to maximize the number of electronic devices that can be mounted within a common enclosure.

In such environments, to adequately protect the electronic devices from overheating, it is also desirable dissipate heat generated by the electronic devices and other system components within the enclosure.

SUMMARY

An enclosure is provided for housing multiple electronic devices. In one embodiment, the enclosure includes a chassis having a floor and opposing sidewalls. Discrete first and second midplanes, each having an opening formed therein, may be disposed in an interior portion of the chassis on opposite sides of a divider wall. The first and second midplanes may be configured to mate to at least one air displacement unit on a back surface of the associated midplane and to mate to at least one device sled on a front surface of the associated midplane. An opening is formed in each midplane adjacent the associated air displacement unit to permit air to pass through the opening.

In one embodiment, the chassis includes a floor and first and second sidewalls adjacent the floor. A divider wall may be positioned on the floor between the first and second sidewalls and may be oriented in parallel relationship with the sidewalls. A set of guides may be disposed on the floor on opposite sides of the divider wall and oriented in parallel relationship with the sidewalls to guide and align device sleds within the enclosure. A shelf may be mounted on the first sidewall for mounting a controller therein to control electronic devices disposed on the device sleds. Slots may be positioned adjacent the first and second walls and on opposing sides of the divider wall for securing midplanes within the chassis.

In another embodiment, a midplane sled includes a floor, opposing sidewalls disposed on the floor, and a front wall, or midplane, adjacent the floor and oriented in orthogonal relationship with the floor. An opening may be formed in the front wall to permit cooling air to pass across the front wall through the opening. Tabs may extend from the front wall for mating with corresponding slots in a chassis. First and second connectors may be attached to first and second sides of the front wall, respectively. The first connector may be used to connect to a drive sled adjacent the first side of the front wall. The second connector may be used to connect to an air displacement unit adjacent the second side of the front wall.

These and other embodiments of the present invention will be readily apparent to those skilled in the art from the following detailed description of the embodiment with reference to the accompanying drawings.

BRIEF DESCRIPTION OF THE DRAWINGS

Features, elements, and aspects of the invention that are referenced by the same numerals in different figures represent the same, equivalent, or similar features, elements, or aspects in accordance with one or more embodiments.

DETAILED DESCRIPTION

In the following, certain embodiments, aspects, advantages, and novel features of the invention have been provided. It is to be understood that not all such advantages may be achieved in accordance with any one particular embodiment. Thus, the invention may be embodied or carried out in a manner that achieves or optimizes one advantage or group of advantages as taught herein without necessarily achieving other advantages as may be taught or suggested herein.

Figure 1:
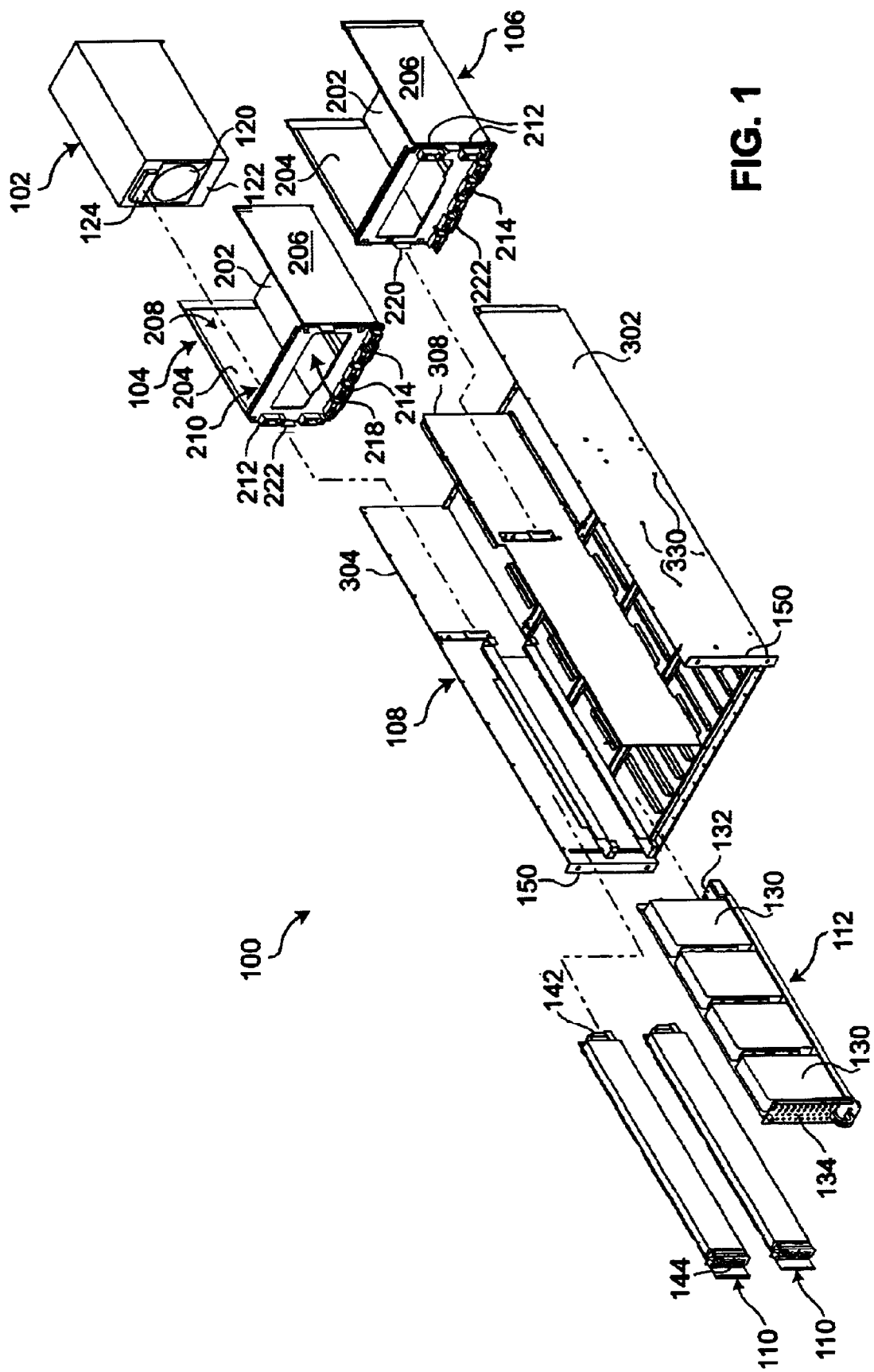
FIG. 1 is an exploded isometric view of an exemplary enclosure, in accordance with one embodiment of the invention.

FIG. 1 illustrates an enclosure 100 for housing removable electronic devices, in accordance with one embodiment of the present invention. The enclosure 100 generally includes an air displacement unit 102, a first midplane sled 104, a second midplane sled 106, a chassis 108, controllers 110, and a device sled 112.

The air displacement unit 102 may comprise a power source (not shown) and one or more fans 120 to provide both power and cooling to associated device sleds 112. The fan 120 may optionally comprise a blower or other suitable air displacement device. In one embodiment, the fan 120 is disposed adjacent a front surface 122 of the air displacement unit 102 and another fan (not shown) is disposed adjacent an opposite rear surface (not shown) to draw air through the power supply unit between the fans 120. Exemplary power sources may include a battery or a power line. Depending on the configuration of the fans 120, the fans 120 may operate to pass air from the front surface 122 through the air displacement unit 102 and out through the rear surface (not shown) of the air displacement unit 102 or in the opposite direction.

The air displacement unit 102 may include an interface connector 124 adjacent the front surface 122 thereof for quick engagement to and disengagement from an associated one of the first and second midplane sleds 104, 106. In one embodiment, the interface connector 124 can be a "blind mate" power connector for providing power to one or more of the device sleds 112.

Figure 2:
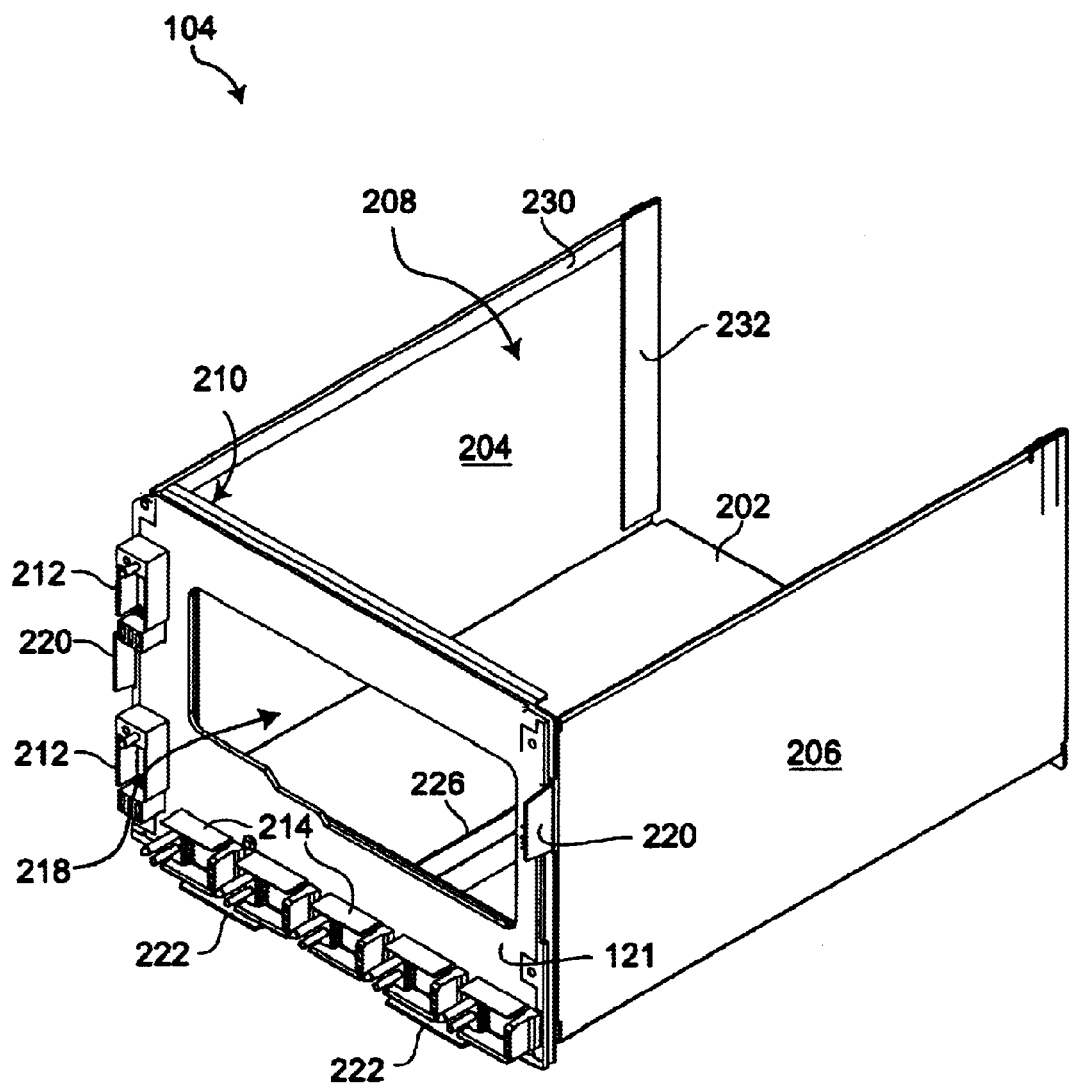
FIG. 2 is an enlarged isometric view of one the midplane sleds of the FIG. 1 enclosure, in accordance with one embodiment.

The first midplane sled 104 may be configured to permit one or more of the air displacement units 102 to be mounted thereon. As shown in FIGS. 1 and 2, the first midplane sled 104 includes a floor 202 and sidewalls 204 and 206. The floor 202 and the sidewalls 204, 206 generally define a cavity 208 into which air supply units 102 may be mounted. The sidewalls 204 and 206 are orthogonal to the floor 202 and may be integrally formed with the floor 202. In one embodiment, the floor 202 and the sidewalls 204, 206 are formed of sheet metal, which may be stamped from a sheet of sheet metal and then bent to form the floor 202 and the sidewalls 204, 206. Of course, the sidewalls 204, 206 and the floor 202 may optionally be formed of other suitable materials.

The first midplane sled 104 also includes a front wall midplane 210. The front wall 210 is disposed between the sidewalls 204 and 206 at one end of the floor 202. The front wall 120 includes connectors 212 for mating with the controllers 110 and connectors 214 for connecting with the device sleds 112 mounted on a front surface 121 thereof.

In one embodiment, the connectors 212 comprise FC-AL (Fibre Channel-Arbitrated Loop) connectors and the connectors 214 comprise VHDM (Very High Density Modular) connectors and may be mounted on the front wall 210 adjacent the sidewall 204. Suitable VHDM connectors are sold by Teradyne Inc. of Boston, Mass.

Blind mate connectors (not shown) may be mounted on a rear surface (not shown) of the front wall 210 for mating with the interface connectors 124 of the air displacement units 102 mounted thereon.

The front wall 210 includes circuitry (not shown) to electrically connect the connectors 214 to the blind mate connectors (not shown) disposed on the rear surface (not shown) of the front wall 210 so that the air displacement units 102, which may each include a power supply unit, may provide power to associated device sleds 112 through the front wall 210. In addition, the connectors 212 are electrically connected through the front wall 210 to the connectors 214 to permit the controllers 110 to control the electronic devices 130 mounted on the device sleds 112. In one embodiment, the connectors 212, 214 and associated circuitry are disposed on a printed circuit board (not shown) mounted on the front wall 210 of the midplane sled 104.

The front wall 210 may also include at least one hole 218 formed therein. As illustrated, the hole 218 is substantially rectangular in cross-section, although the hole 218 may comprise different shapes. The hole 218 is positioned in the front wall 210 so that when air displacement units 102 are mounted within the midplane sled 104, the associated fans 120 are aligned with the hole 218. Optionally, a separate hole may be formed through the front wall 210 and aligned with each of the fans 120. In this configuration, the fans 120 may cause air to pass through the hole 218 to cool the device sleds 112 adjacent the hole 218 as well as electronic devices 130 mounted on the device sleds 112.

Tabs 220 and 222 may be positioned adjacent the front wall 210 of the midplane sleds 104, 106 and assist in securing the associated midplane sleds 104, 106 within the chassis 108. The tabs 220 may extend from the sidewalls 204 and 206 away from the front wall 210. The tabs 220 may be generally parallel to the sidewalls 204 and 206 and, in one embodiment, are coplanar with the sidewalls 204 and 206. The tabs 220 may comprise rectangular protrusions from the sidewalls 204 and 206 and may be formed integrally with the sidewalls 204 and 206.

Similarly, the tabs 222 may extend from the floor 202 of the midplane sled 104 or from the front wall 210. The tabs 222 may be generally parallel to the floor 202 and, in one embodiment, are coplanar with the floor 202. The tabs 222 may comprise rectangular protrusions from the floor 202 and may be formed integrally with the floor 202.

Optionally, the tabs 220 and 222 may be formed integrally with the front wall 210 or may comprise discrete components mounted on either the front wall 210 or the sidewalls 204, 206 and floor 202, respectively.

In addition, one or more guides 226 may be mounted on the floor 202 of the midplane sled 104 to properly align, or position, the air displacement units 102 within the power supply unit sled 104. Each guide 226 may comprise an elongated member secured to the floor 202 and oriented parallel to the sidewalls 204, 206. In one embodiment, a single guide 226 is positioned approximately equidistant, or along the approximate centerline, between the sidewalls 204 and 206. The guide 226 may comprise an elongated member having a cross-section that is substantially L-shaped. Thus, the guide 226 divides the floor 202 into substantially equal sections and maintains air displacement units 102 disposed on the floor 202 within the equal sections. Hence, the guide 226 properly aligns the air displacement units 102 relative to the midplane sled 104 and facilitates connection of the interface connector 124 of each air displacement unit 102 with the corresponding connector (not shown) disposed on the rear surface of the front wall 210.

In addition, to provide for additional strength and rigidity, top edges 230 and end edges 232 may be bent, or folded, 180 degrees. The bent top and end edges 230 and 232 also provide smooth edges for the midplane sled 104.

The midplane sled 106 may be identical to the midplane sled 104, except as follows. The connectors 212 of the midplane sled 106 may be mounted on the front wall 210 adjacent the sidewall 206 to mount with controllers (not shown) mounted on the chassis 108 adjacent the sidewall 206 of the sled 106.

The chassis 108 may comprise a floor 302, opposing sidewalls 304 and 306, and divider wall 308. The sidewalls 304 and 306 of the chassis 108 are formed parallel to each other on opposing sides of the floor 302 and are oriented substantially orthogonal to the floor 302. The sidewalls 304 and 306 may be formed integrally with the floor 302 or may be otherwise mounted thereon. The divider wall 308 is mounted on the floor 302 of the chassis 108 between the sidewalls 304 and 306 and is oriented orthogonal to the floor 302 and parallel to the sidewalls 304 and 306. The midplane sled 104 is mounted within the chassis 108 between the sidewall 304 and the divider wall 308. Similarly, the midplane sled 106 is mounted within the chassis 108 between the sidewall 306 and the divider wall 308.

Receiving members 310 are secured to opposite sides of the divider wall 308 and to the sidewalls 304 and 306 by fasteners 311. The receiving members 310 include slots 312 for receiving corresponding tabs 220 of the midplane sleds 104 and 106. As the midplane sleds 104 and 106 are inserted into the chassis 108, the tabs 220 are advanced into the chassis 108 until the tabs 220 enter corresponding slots 312. With the tabs 220 inserted into the slots 312, the receiving members 310 substantially limit, or prevent, movement of the midplane sleds 104, 106 in the same plane as the floor 302.

In addition, receiving members 316 having slots 318 are secured to the floor 302 of the chassis 108 by fasteners 320. The slots 318 receive the tabs 222 (FIG. 2) of the midplane sleds 104, 106. With the tabs 222 inserted in the slots 318, the receiving members 316 substantially limit, or prevent, movement of the midplane sleds 104, 106 in a plane orthogonal to the floor 302 of the chassis 108.

The midplane sleds 104, 106 are secured within the chassis 108 by positioning the floor 202 of each of the midplane sleds 104, 106 adjacent the floor 302 of the chassis 108. The tabs 220 and 222 are then advanced into the slots 312 and 318, respectively. In this configuration, the midplane sled 104 is securely positioned between the sidewall 304 and the divider wall 308 and the midplane sled 106 is securely positioned between the sidewall 306 and the divider wall 308.

A controller brace 324 is mounted on each of the sidewalls 304 and 306 inside the chassis 108 to secure the controllers 110 within the chassis 108. As shown, the controller brace 324 includes top and bottom shelves 326 and 328, which may be secured to the sidewalls 304 and 306 by fasteners 330. The top and bottom shelves 326 and 328 may each have a cross-section that is substantially L-shaped and include first and second portions 332 and 334 that are oriented orthogonal to each other. One of the controllers 110 is positioned on each first portion 332 between the second portion 334 and the associated sidewall, such as the sidewall 304. The controllers 110 also connect to the connectors 212 of the midplane sleds 104 and 106. In one embodiment, the top and bottom shelves 326 and 328 may be integrally formed from a common piece of sheet metal that is bent to form the first and second portions 332, 334 of the top and bottom shelves 326, 328. Moreover, in this configuration the midplane sleds 104, 106 may be individually removed from the chassis 108 in an efficient manner.

Guides 340 are mounted on the floor 302 of the chassis 108 on an opposite side of the receiving features 316 as the midplane sleds 104, 106. The guides 340 may be oriented parallel to the sidewalls 304, 306 and can be equidistant apart, such that two adjacent guides 340 may slidably receive one of the device sleds 112 between the two adjacent guides 340. The guides 340 may each have an L-shaped cross-section.

In one example embodiment, the guides 340 are arranged to permit five (5) device sleds 112 to be inserted into the chassis 108 on each side of the divider wall 308 so that the chassis 108 can simultaneously house ten (10) of the device sleds 112. It should be noted that a device sled 112 may also be disposed between the sidewall 302 and a guide 340 and between the sidewall 304 and a guide 340. Further, a pair of device sleds 112 may be disposed adjacent opposite sides of the divider wall 308 and guides 340.

Figure 4:
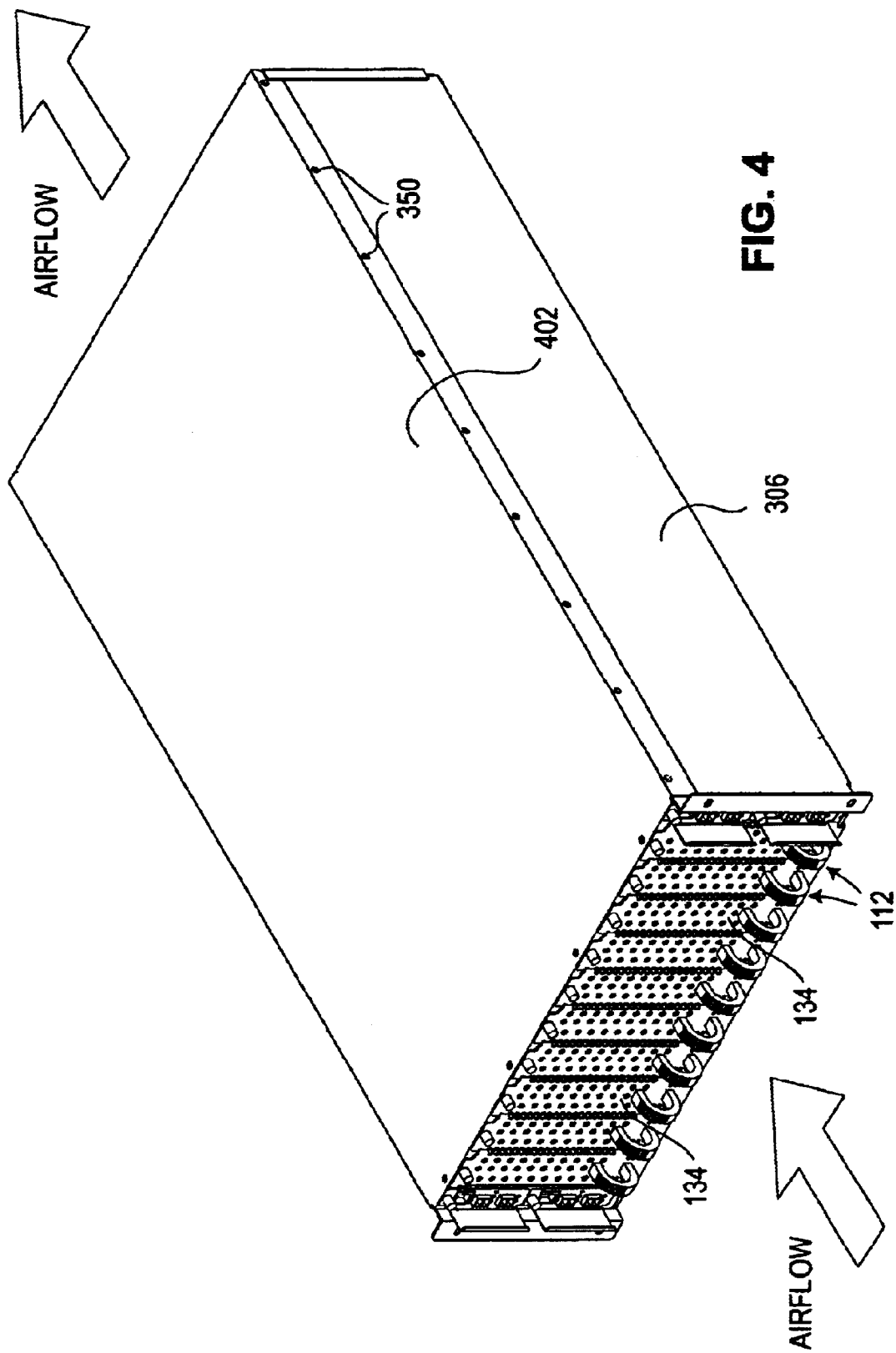
FIG. 4 is an isometric view of the FIG. 1 enclosure with a cover mounted thereon.

The divider wall 308 has a flange 344 disposed along an edge thereof opposite the floor 302 of the chassis 108. The flange 344 has a top surface 346, which is substantially parallel to the floor 302 and may provide support for a cover 400 (FIG. 4). Holes 350 are formed through the sidewalls 304 and 306 adjacent top edges thereof to permit fastening of the cover 400 to the sidewalls 304 and 306.

The device sled 112 comprises a mounting interface for one or more electronic devices 130, which may comprise data storage devices. An interface connector 132 may be coupled to or incorporated on the device sled 112 to provide for ready engagement and disengagement with a corresponding one of the connectors 214.

In some embodiments, the device sled 112 may be configured for mounting a 4×1 array of data storage devices. The data storage devices may comprise any of a variety of storage devices, such as high density disk drives, optical drives, CD ROM drives, floppy disk drives, or the like. In one example embodiment, each of the data storage devices has a height of about 1 inch (about 2.54 centimeters). Of course, the device sled 112 may be configured to accommodate different numbers, sizes, and types of the electronic devices 130.

The electronic devices 130 are each coupled to the interface connector 132 with suitable interfaces (not shown) disposed on the device sled 112. A perforated plate 134 may be disposed on the device sled 112 opposite the interface connector 132. The perforated plate 134 may permit air to pass across the perforated plate 134 to help cool the electronic devices 130.

The controllers 110, for example, may comprise FC-AL controllers for controlling the electronic devices 130, where the electronic storage device comprise data storage devices. Each of the controllers 110 may comprise an elongated member having an interface connector 142 mounted on one end thereof for connecting with one of the connectors 212 of one of the midplane sleds 104, 106 and connectors 144 on an opposite end for connecting to other devices (not shown).

In one embodiment, the controllers 10 comprise redundant controllers that control the electronic devices 130 disposed on a same side of the divider wall 308 as the controllers 110. If one of the controllers 10 is removed or malfunctions, the electronic devices 130 may be controlled by the other of the controllers 100 to provide robust control for the various electronic devices 130.

Accordingly, the enclosure 100 may be assembled by mounting a pair of air displacement units 102 within each of the midplane sleds 104 and 106. The fan 120 of each of the air displacement units 102 may be positioned adjacent the hole 218 of the front wall 210 of the associated midplane sled 104, 106. In addition, the interface connector 124 of each of the air displacement units 102 is connected to a corresponding connector (not shown) mounted on the rear surface (not shown) of the front wall 210 of the associated midplane sled 104, 106.

The midplane sleds 104, 106 may be slid into the chassis 108 on opposite sides of the divider wall 308 with the floors 202 of the midplane sleds 104, 106 resting on and being adjacent to the floor 302 of the chassis 108. The midplane sleds 104, 106 may then be slid relative to the floor 302 of the chassis 108 until the tabs 220 and 222 engage and are inserted into the slots 312 and 318, respectively.

The controllers 110 may be positioned on the shelves 326 and 328 and are advanced until the connectors 142 engage and connect with the corresponding connectors 212 of the associated one of the midplane sleds 104, 106. A second set of controllers (not shown) are also mounted on the inside of sidewall 302 via shelves identical to the shelves 326, 328 for controlling electronic devices 130 disposed on the same side of the divider wall 308 as the sidewall 302.

Figure 3:
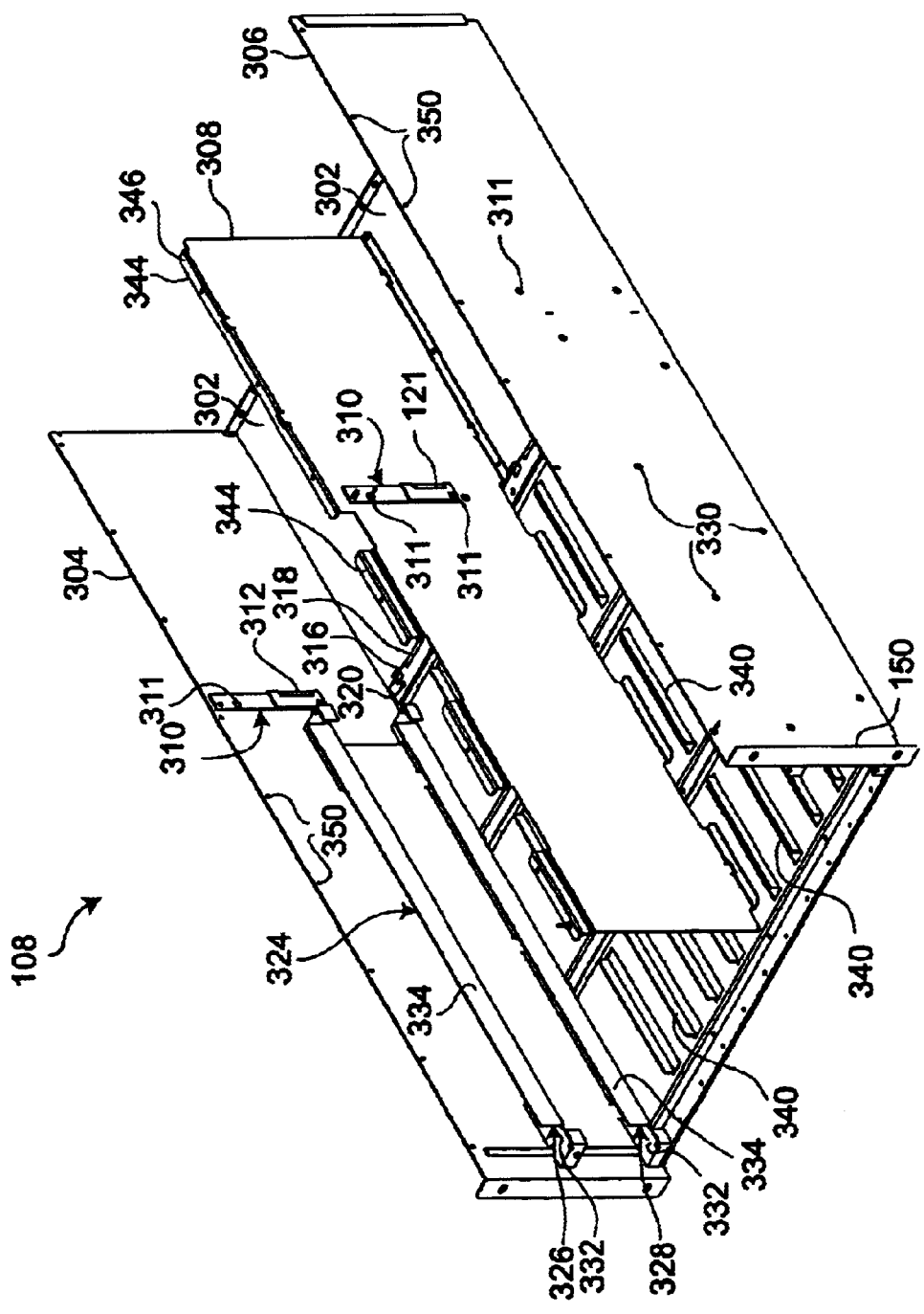
FIG. 3 is an enlarged isometric view of the chassis of the FIG. 1 enclosure, in accordance with one embodiment.

One or more device sleds 112 may be inserted into the chassis 108 by sliding each device sled 112 adjacent one or more guides 340 (FIG. 3). Each device sled 112 may be advanced until the interface connector 132 of the device sled 112 mates with a corresponding one of the connectors 214 of the associated air displacement unit sled 104, 106. Multiple device sleds 112, each having one or more electronic devices 130 mounted thereon, may be inserted into the chassis 108 in a similar manner.

Figure 5:
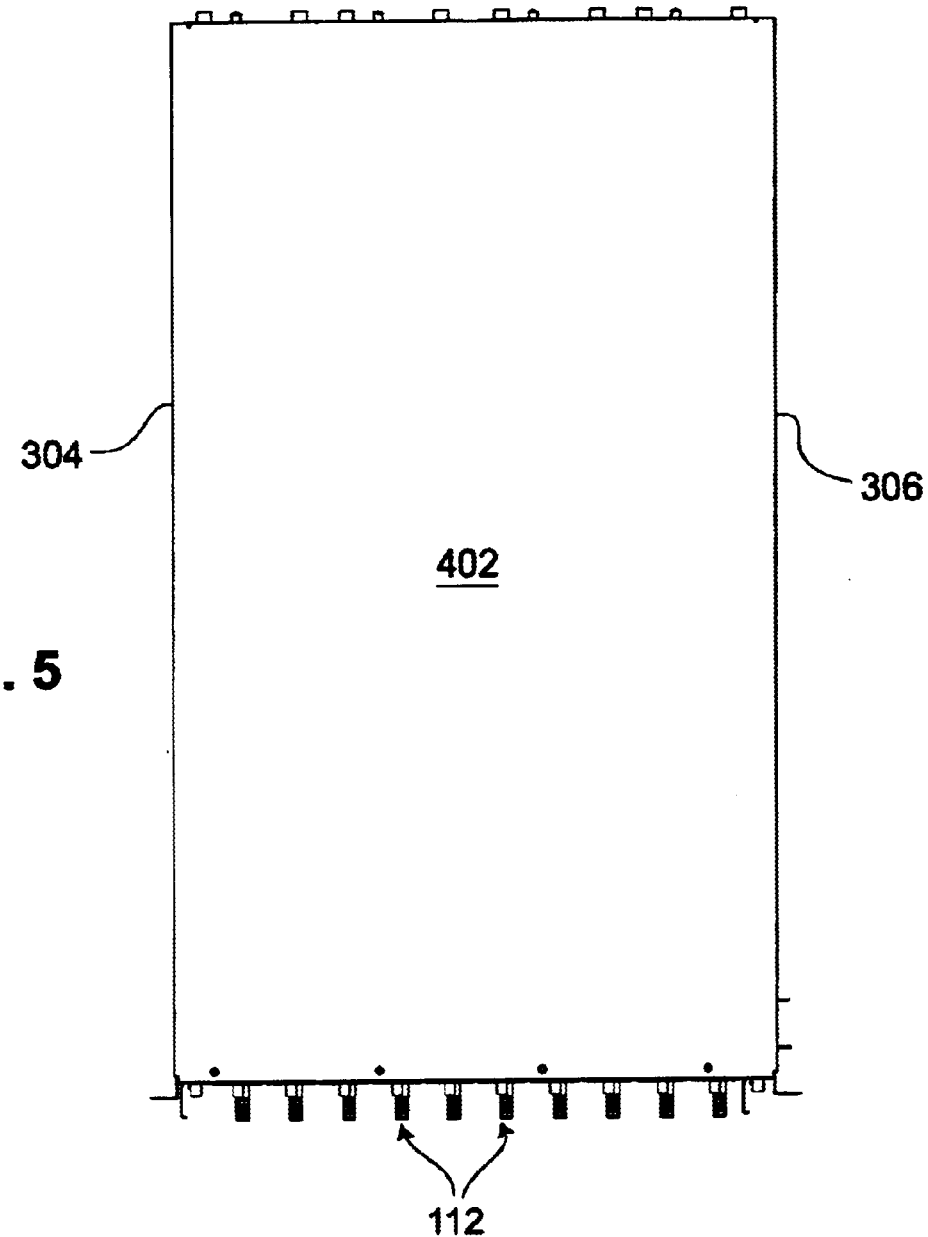
FIG. 5 is a top plan view of the FIG. 1 enclosure with a cover mounted thereon.
Figure 6:
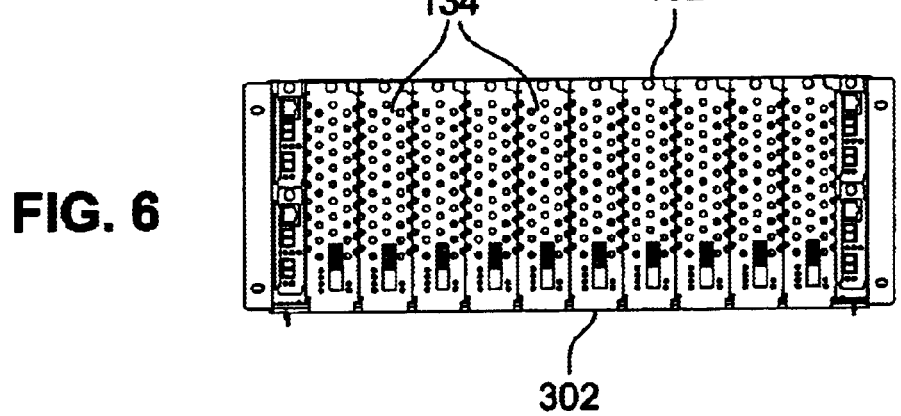
FIG. 6 is a front elevation view of the FIG. 1 enclosure with a cover mounted thereon.

A cover 402 (FIGS. 4 and 5) may be secured to the chassis 108 via holes 350. In this configuration, the fans 120 of the air displacement units 102 may generate a flow of air through the chassis 108 on each side of the divider wall 308. Pursuant to one embodiment, and as illustrated in FIG. 4, the fans 120 draw air through the perforated plates 134, over the electronic devices 130, through the air displacement units 102 and discharge the air adjacent rear surfaces of the air displacement units 102.

The fans 120 of the air displacement units 102 of the midplane sled 104 displace air between the sidewall 304 and the divider wall 308. Similarly, fans 120 of the air displacement units 102 of the midplane sled 106 displace air between the sidewall 302 and the divider wall 308. Thus, the divider wall 308 serves to divide, or to maintain separate, streams of air flow through the chassis 108.

The enclosure 100 is modular in that the device sleds 112 or midplane sled 104 between the divider wall 308 and the sidewall 304 may be disabled or removed without significantly disrupting the operation or the cooling of the electronic devices 130 positioned between the divider wall 308 and the sidewall 302, and vice versa. Additionally, the device sleds 112 and the midplane sleds 104, 106 are easy to remove or replace.

Further, one or more of the device sleds 112 may be removed from the enclosure 100 without significantly disrupting operation of the other device sleds 112 within the chassis 108. Thus, pursuant to one embodiment, to replace a single electronic device 130, only a single sled 112 need be removed from the chassis 108. This permits other electronic devices 130 to continue uninterrupted operation.

The present enclosure 100 also provides for the mounting of a large number of electronic devices 130 within a common enclosure while providing adequate cooling and protection to the various electronic devices 130. In one embodiment, ten device sleds 112, each having four one-inch data storage devices mounted thereon, are simultaneously disposed in the enclosure 100. Although the height of the enclosure 100 may vary, in one example embodiment, the enclosure 100 is 4U, or about 7 inches (4*1.75 inches) (about 17.8 cm), high and includes front flanges 150 to facilitate mounting the enclosure in a conventional rack mount cabinet.

The embodiments described above are to be considered in all aspects as illustrative only and not restrictive in any manner. Other exemplary embodiments and implementations that can support various aspects of the invention may be utilized without departing from the essential characteristics described herein. These and various other adaptations and combinations of features of the embodiments disclosed are within the scope of the invention.

What is claimed is:

1. An enclosure comprising:

a chassis having a floor, first and second sidewalls disposed on opposite sides of the floor, and a divider wall disposed on the floor between the first and second sidewalls;

first and second midplane sleds, each midplane sled having a front wall midplane and a hole formed through the front wall midplane, the front wall midplane having first and second surfaces, the first surface of the front wall midplane being configured to connect to at least one device sled and the second surface of the front wall midplane being configured to connect at least one power supply unit;

the first midplane sled being removably disposed between the first sidewall and the divider wall and the second midplane sled being removably disposed between the second sidewall and the divider wall;

first device sleds removably disposed between the first sidewall and the divider wall and adjacent the first midplane sled;

second device sleds removably disposed between the second sidewall and the divider wall and adjacent the second midplane sled.

2. The enclosure of claim 1, wherein the divider wall is oriented in parallel relationship with the first and second sidewalls.

3. The enclosure of claim 1, wherein the divider wall is oriented in orthogonal relationship to the floor of the chassis.

4. The enclosure of claim 1, further comprising a shelf disposed on the first sidewall for permitting mounting of a controller thereon.

5. The enclosure of claim 1, wherein each of the device sleds includes multiple data storage devices.

6. A midplane sled comprising:

a floor, opposing sidewalls disposed on the floor and oriented in orthogonal relationship with the floor;

a front wall midplane disposed on the floor and oriented in orthogonal relationship with the floor, the front wall midplane being oriented in orthogonal relationship with each of the sidewalls, the front wall midplane having first and second sides;

an opening formed in the front wall midplane;

tabs extending from the front wall midplane adjacent the first side of the front wall midplane for mating with corresponding slots in a chassis;

a first connector attached to the first side of the front wall midplane for mating with a corresponding connector of a device sled;

a second connector attached to the second side of the front wall midplane for mating with a corresponding connector of an air displacement unit removably disposed in the midplane sled.

7. The midplane sled of claim 6, comprising a third connector attached to the first side of the front wall for mating with a controller.

8. The midplane sled of claim 6, further comprising a guide disposed on the floor, the guide being oriented in parallel relationship to the opposing sidewalls.

9. A chassis comprising:

a floor;

first and second sidewalls adjacent the floor;

a divider wall running the length of the floor and positioned between the first and second sidewalls, the divider wall oriented in parallel relationship with the sidewalls;

guides for device sleds disposed on the floor on opposite sides of the divider wall and oriented in parallel relationship with the sidewalls;

a shelf mounted on the first sidewall, the shelf permitting mounting thereon a controller for devices on the device sleds;

slots positioned adjacent the first and the second sidewalls and on opposing sides of the divider wall.

10. The chassis of claim 9, further comprising slots positioned adjacent the floor.

11. The chassis of claim 9, further comprising first and second midplane sleds disposed on the floor and positioned on opposite sides of the divider wall.

12. The chassis of claim 9, fisher comprising first and second midplane sleds disposed on the floor and positioned on opposite sides of the divider wall, wherein each of the first and second midplane sleds further comprises tabs extending therefrom for mating with the slots.

13. The chassis of claim 9, further comprising the device sleds disposed between adjacent guides.

14. The chassis of claim 9, further comprising:

a first midplane sled disposed on the floor and positioned between the first sidewall and the divider wall;

first device sleds disposed on the floor and positioned between the first sidewall and the divider wall, the first device sleds being connected to the first midplane sled;

a second midplane sled disposed on the floor and positioned between the second sidewall and the divider wall;

second device sleds disposed on the floor and positioned between the second sidewall and the divider wall, the second device sleds being connected to the second midplane sled.

15. A disk enclosure, comprising:

a chassis comprising a floor, a first sidewall, and a second sidewall, a midplane located in the chassis, the midplane being orthogonal to the first and the second sidewalls, the midplane comprising a front side having a connector for mating with a disk sled, the midplane comprising a back side having a second connector for mating with an air displacement unit, the midplane defining an opening so the air displacement unit displaces air through the opening to cool the disk sled; and the air displacement unit comprising a first fan adjacent to a first surface of the air displacement unit, a power source, and a second fan adjacent to a rear surface of the air displacement unit.

16. The disk enclosure of claim 15, further comprising the disk sled, wherein the disk sled includes disk drives.

17. The disk enclosure of claim 16, further comprising guides disposed on the floor and oriented parallel with the first and the second sidewalls, wherein the disk sleds being removably disposed between two of the guides.

18. The disk enclosure of claim 15, further comprising a divider wall located in the chassis, the divider wall being parallel to the fire and the second sidewalls.

19. The disk enclosure of claim 18, wherein the midplane comprises a front wall of a midplane sled, the midplane sled being removably disposed between the first sidewall and the divider wall.

\* \* \* \* \*